United States Patent
Ozawa et al.

[11] Patent Number: 6,094,369
[45] Date of Patent: Jul. 25, 2000

[54] FERROELECTRIC NONVOLATILE MEMORY ELEMENT HAVING CAPACITORS OF SAME DIELECTRIC CONSTANT AND METHOD THEREOF

[75] Inventors: Takanori Ozawa; Takaaki Fuchikami, both of Kyoto, Japan

[73] Assignee: Rohm Co., Ltd., Kyoto, Japan

[21] Appl. No.: 09/100,263

[22] Filed: Jun. 19, 1998

[30] Foreign Application Priority Data

Jun. 23, 1997 [JP] Japan .................................. 9-165924

[51] Int. Cl.[7] .................................................. G11C 11/22
[52] U.S. Cl. .............................. 365/145; 326/44; 326/39; 257/295
[58] Field of Search .............................. 365/145; 326/44, 326/39; 257/295

[56] References Cited

U.S. PATENT DOCUMENTS

| | | | |
|---|---|---|---|
| 5,357,460 | 10/1994 | Yusuki et al. .............................. | 365/145 |
| 5,382,817 | 1/1995 | Kashihara et al. ....................... | 257/295 |
| 5,436,477 | 7/1995 | Hashizume et al. ..................... | 257/310 |
| 5,495,117 | 2/1996 | Larson ..................................... | 257/295 |
| 5,561,307 | 10/1996 | Mihara et al. ........................... | 257/295 |
| 5,612,574 | 3/1997 | Summerfelt et al. .................... | 257/783 |
| 5,638,319 | 6/1997 | Onishi et al. ............................ | 365/145 |
| 5,654,567 | 8/1997 | Numata et al. .......................... | 257/306 |

*Primary Examiner*—Andrew Q. Tran
*Attorney, Agent, or Firm*—Merchant & Gould P.C.

[57] ABSTRACT

A nonvolatile memory element capable of using desired ferroelectric materials, exhibiting a high reliability and performing processings such as reading of information without destruction of stored contents is provided. A memory cell comprises two capacitors Cf1 and Cf2 connected to each other in series. Both capacitors are ferroelectric capacitors manufactured by the same steps. Accordingly, the coupling ratio between both capacitors can be changed by only the change of surface areas thereof. A voltage corresponding to the information to be stored is applied to the opposite ends of the memory cell 20 to cause polarization reversal and as a result, the information is written thereinto. In order to read the stored information, a ground potential is applied to the opposite ends of the memory cell 20. On the basis of the potential generated at a connection 20c upon the application of the ground potential, the information can be read.

20 Claims, 11 Drawing Sheets

FIG.4A

|  | WL | DL0 | DL1 | SL |
|---|---|---|---|---|
| "1" | H | L | H | * |
| "0" | H | H | L | * |

*: L, H, or OPEN writing

FIG.4B

| WL | DL0 | DL1 | SL |
|---|---|---|---|
| H | L | L or OPEN | Vs | reading

FIG.9A

|   | WL | DL0 | DL1 | SL |
|---|---|---|---|---|
| "1" | H | L | H | * |
| "0" | H | H | L | * |

*: L, H, or OPEN writing

FIG.9B

| WL | DL0 | DL1 |
|---|---|---|
| H | L | L or OPEN | switching operation

FERROELECTRIC NONVOLATILE MEMORY ELEMENT HAVING CAPACITORS OF SAME DIELECTRIC CONSTANT AND METHOD THEREOF

CROSS-REFERENCE TO RELATED APPLICATION

The entire disclosure of Japanese Patent Application No. Hei 9-165924 filed on Jun. 23, 1997 including specification, claims, drawings and summary are incorporated herein by reference in its entirety.

BACKGROUND OF THE INVENTION

1. Field of the Invention

This invention relates to a nonvolatile memory element, and more particularly to techniques for storing an information by utilizing hysteresis characteristics of ferroelectrics.

2. Description of the Prior Art

As nonvolatile memories, there have been proposed FETs (field effect transistors) using a ferroelectric film. An example of FETs using such a ferroelectric film (e.g., films made of PZT ($PbZr_xTi_{1-x}O_3$)) is shown in FIG. 10. The FET 12 shown in FIG. 10 is called an FET of an MFMIS type (Metal Ferroelectric Metal Insulator Silicon), and includes a semiconductor substrate 2 having a channel forming region CH on which a gate oxide film 4, a floating gate 6, a ferroelectric film 8 and a control gate 10 in turn are formed in this order.

When the substrate 2 of the FET (N-channel) is connected to ground and a positive voltage +V is applied to the control gate 10, the ferroelectric film 8 undergoes polarization reversal. Even when the voltage applied to the control gate 10 is released, a negative charge is generated in the channel forming region CH due to remanent polarization of the ferroelectric film 8. This state is set as "1".

On the contrary, when a negative voltage −V is applied to the control gate 10, the ferroelectric film is allowed to undergo polarization reversal in the direction opposite to that in which polarization reversal occurs due to the application of positive voltage +V. Even when the negative voltage applied to the control gate 10 is released, a positive charge is generated in the channel forming region CH due to remanent polarization of the ferroelectric film 8. This state is set as "0". In such a manner, the information ("1" or "0") is written in FET 12.

In order to read the written information, a read voltage Vr is applied to the control gate 10. The read voltage Vr is set to a value between a threshold voltage Vth1 of the FET in "1" state and a threshold voltage Vth0 of the FET in "0" state. Accordingly, when the read voltage Vr is applied to the control gate 10, the written information "1" or "0" can be recognized by determining whether or not a predetermined drain current is detected. Upon the read operation, the written information is not erased.

Thus, the FET using a ferroelectric film enables so-called nondestructive read. For this reason, in such an FET, the stored content can be prevented from being destroyed at each time of read operations. This ensures a high operating speed upon the read operation, and a low power consumption. Further, since the ferroelectric film shows less deterioration, the stored content can be retained with a relatively high reliability.

However, the above-mentioned FET using the ferroelectric film has the following problems. As shown in FIG. 11, upon write operation, the FET 12 has such a configuration that a capacitor Cf (capacitance Cf) including the ferroelectric film 8 and a capacitor C0 (capacitance C0) including the gate oxide film 4 are connected in series to each other. Therefore, in the case where the voltage V (=+V or −V) is applied between the substrate 2 and the control gate 10, the capacitor Cf including the ferroelectric film 8 is applied with a divided voltage Vf represented by the following equation:

$$Vf = C0/(Cf+C0) \cdot V$$

When it is intended to cause polarization reversal of the ferroelectric film 8 upon write operation, it is necessary to increase the above-mentioned divided voltage to some extent. To this end, as is recognized from the above-mentioned equation, it is required to reduce the capacitance of the capacitor Cf relative to that of the capacitor C0 to some extent. However, the relative dielectric constant $\epsilon f$ (200 to 1,000) of PZT from which the ferroelectric film 8 is formed, is considerably large as compared to the relative dielectric constant $\epsilon 0$ (3.9) of $SiO_2$ from which the gate oxide film 4 is formed.

For this reason, if both the thickness $t_0$ of the gate oxide film 4 and the thickness $t_f$ of the ferroelectric film 8 are kept constant, it is required that the gate oxide film 8 has a considerably large area as compared to that of the ferroelectric film 8, in order to increase the divided voltage Vf according to the above-mentioned equation. This inhibits intended miniaturization of the nonvolatile memory.

On the other hand, the divided voltage Vf according to the above-mentioned equation can also be increased by decreasing the dielectric constant of the ferroelectric film 8 up to approximately a similar level to that of the gate oxide film 4. However, it is not easy to reduce the dielectric constant of the ferroelectric film 8. In order to reduce the dielectric constant of the ferroelectric film 8 to a level similar to that of the gate oxide film 4, a material of the ferroelectric film 8 must be limited to particular ones. However, in the case where such particular materials are used, it becomes difficult to produce a ferroelectric film having desired properties.

Further, when the read voltage Vr is applied to the control gate 10 (refer to FIG. 10) in read operation, the polarization reversal of the ferroelectric film 8 is not normally caused. However, while such a read operation is repeated many times, the remanent polarization of the ferroelectric film 8 is gradually decreased, so that read error is likely to occur.

SUMMARY OF THE INVENTION

It is an object of the present invention to provide a nonvolatile memory element free from the above-mentioned problems, and capable of using desired ferroelectric materials, exhibiting a high reliability and performing processings such as reading of information without destruction of stored contents.

In a first aspect of the present invention, there is provided a nonvolatile memory element for storing an information with the utilization of hysteresis characteristics of ferroelectrics, comprising:

a first capacitor provided with a ferroelectric film and electrically connected with first and second ends;

a second capacitor provided with a ferroelectric film having a dielectric constant substantially equal to that of said ferroelectric film of said first capacitor and electrically connected to first and second ends, said second end of said first capacitor being connected to said first end of said second capacitor so that said first and second capacitors are connected in series to each other;

means for applying a voltage corresponding to said information between said first end of said first capacitor and said second end of said second capacitor; and processing means connected to said first and second capacitors for performing predetermined processing according to a voltage at a point at which said second end of said first capacitor and said first end of said second capacitor are connected.

In a second aspect of the present invention, there is provided a method of storing an information with the utilization of hysteresis characteristics of ferroelectrics, comprising the steps of:

providing first and second capacitors having substantially the same dielectric constant and each having first and second ends, said second end of said first capacitor being connected to said first end of said second capacitor so that said first and second capacitors are connected in series to each other, and at least one of said first and second capacitors being said ferroelctrics; and applying a voltage corresponding to said information between said first end of said first capacitor and said second end of said second capacitor, so that said information is stored in said ferroelectrics.

In a third aspect of the present invention, there is provided a method of processing a stored information with the utilization of hysteresis characteristics of ferroelectrics, comprising the steps of:

providing first and second capacitors having substantially the same dielectric constant and each having first and second ends, said second end of said first capacitor being connected to said first end of said second capacitor so that said first and second capacitors are connected in series to each other, and at least one of said first and second capacitors being said ferroelctrics;

equalizing the potential of said first end of said first capacitor and the potential of said second end of said second capacitor, so that a voltage is generated at a point at which said second end of said first capacitor and said first end of said second capacitor are connected; and processing said stored information according to said voltage.

Although the features of the present invention are set forth above, construction and contents of the invention will be better understood from the following detailed descriptions when read in conjunction with the accompanying drawings.

BRIEF DESCRIPTION OF THE DRAWINGS

FIG. 4A shows an operation table upon writing;

FIG. 4B shows an operation table upon reading;

FIG. 9A shows an operation table when an information is written in the memory cell 20;

FIG. 9B shows an operation table upon switching operation;

DESCRIPTION OF THE PREFERRED EMBODIMENT

Figure 1:
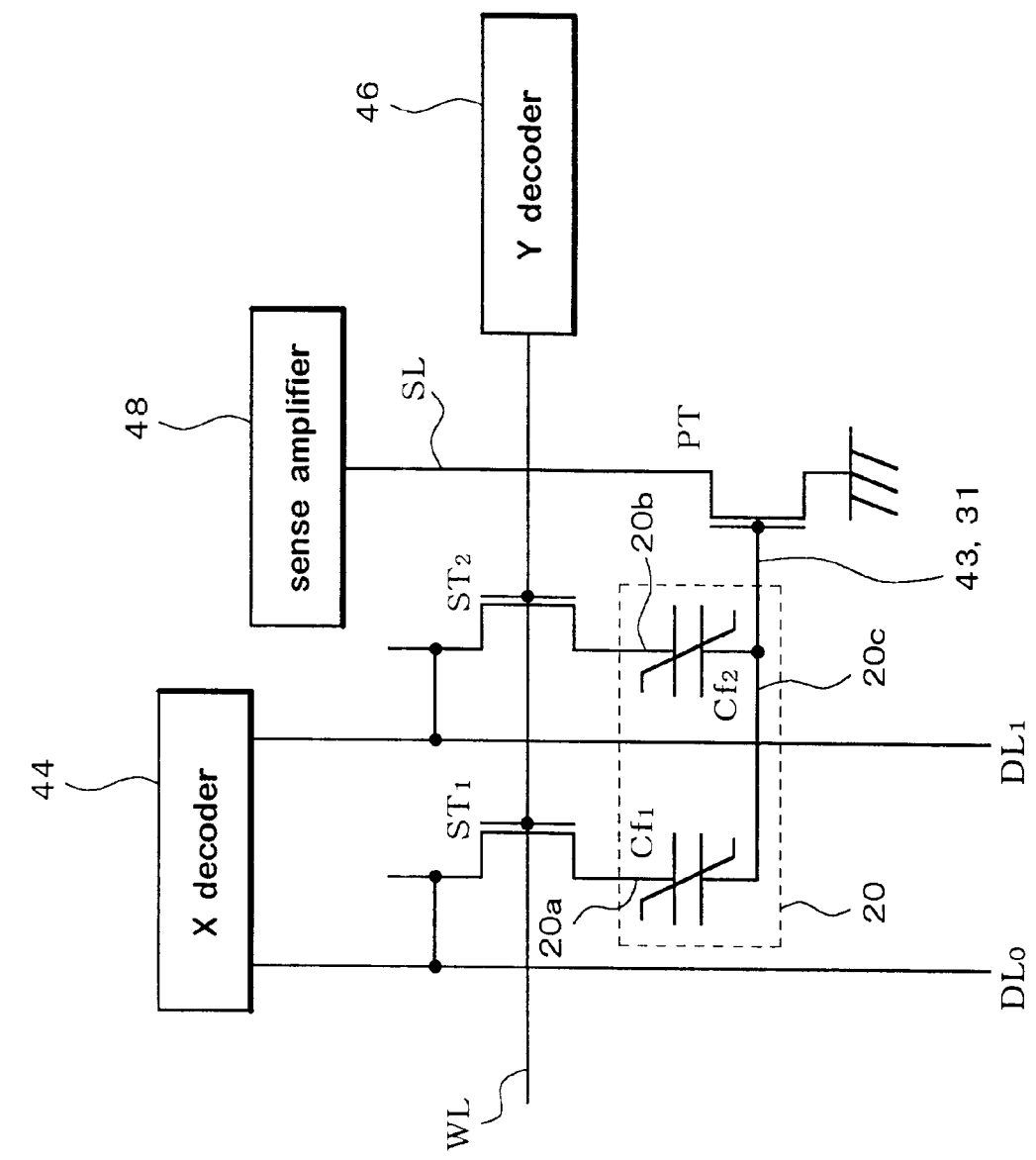
FIG. 1 is a circuit diagram showing a part of a nonvolatile memory provided with a memory cell 20 as a nonvolatile memory element according to a preferred embodiment of the present invention.

In FIG. 1, there is shown a part of a nonvolatile memory provided with a memory cell 20 as a nonvolatile memory element according to one preferred embodiment of the present invention. The memory cell 20 is a nonvolatile memory element capable of storing an information by utilizing hysteresis characteristics of ferroelectrics, and includes a first capacitor Cf1 and a second capacitor Cf2 connected in series with each other.

As described hereinafter, the capacitor Cf1 is constituted as a ferroelectric capacitor provided with a ferroelectric film 36 (refer to FIG. 3A). Also, the capacitor Cf2 is manufactured by similar steps and therefore has almost the same structure as that of capacitor Cf1. Accordingly, The capacitors Cf1 and Cf2 both are of a ferroelectric type formed from the same ferroelectric material (i.e., those having the same dielectric constant) and having the same thickness. The coupling ratio (capacitance ratio) between the capacitors Cf1 and Cf2 is controlled by varying an area ratio between upper electrodes 38 and 138 of the respective capacitors (refer to FIG. 2). In this embodiment, the area ratio of the upper electrode 38 of the capacitor Cf1 to the upper electrode 138 of the capacitor Cf2 is set to about 2:1.

The opposite ends 20a and 20b of the memory cell 20 constituted by the capacitors Cf1 and Cf2 connected in series to each other, are connected to a source 26 of a select transistor ST1 and a source of a select transistor ST2, respectively. A drain 28 of the select transistor ST1 and a drain of the select transistor ST2 are connected to data lines DL0 and DL1, respectively. Gates of the select transistors ST1 and ST2 are connected to a word line WL. The word line WL is connected to a Y decoder 46. The Y decoder operates to turn ON or OFF the select transistors ST1 and ST2 in response to commands from a control (not shown).

The data lines DL0 and DL1 are connected to an X decoder 44. The X decoder 44 operates to set the data lines DL0 and DL1 to any of states "H", "L" and "OPEN" in response to commands from a control (not shown). A voltage corresponding to an information to be stored is applied to the opposite ends of the memory cell 20 via the data lines DL0 and DL1 and the select transistors ST1 and ST2, to write the information in the memory cell 20.

Figure 2:
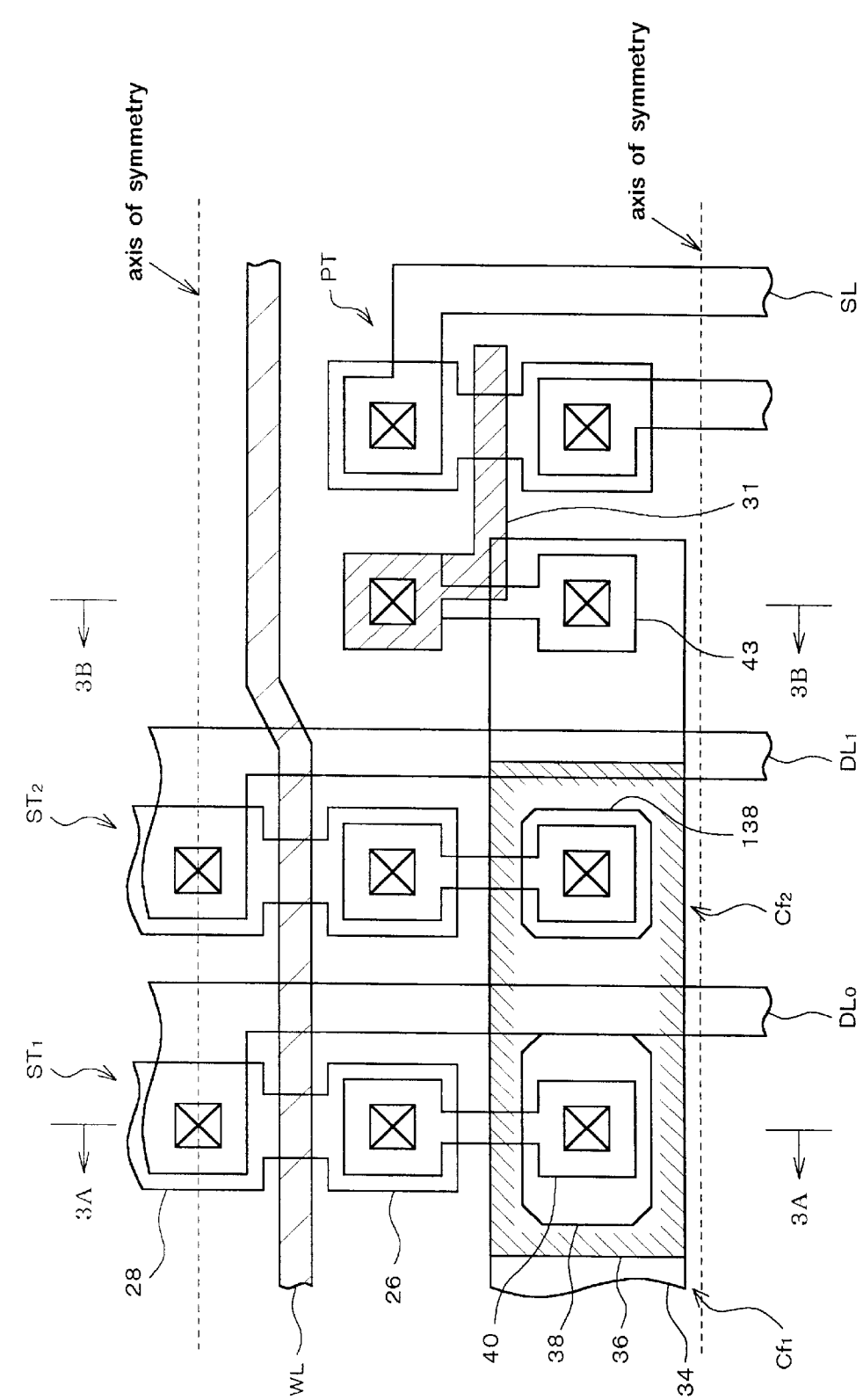
FIG. 2 is a plan view showing an exemplary arrangement of the memory cell 20 and peripheral portions thereof.

A connection 20c between the capacitors Cf1 and Cf2 of the memory cell 20 (refer to FIG. 1) is connected to a gate of a processing transistor PT via an aluminum wiring 43 and a gate wiring 31 (refer to FIG. 2). The capacitance of a capacitor (not shown) whose dielectric film is constituted by a gate oxide film of the processing transistor PT, is as low as substantially negligible or ignorable upon writing relative to any of capacitances of the capacitors Cf1 and Cf2.

A drain of the processing transistor PT is connected to a sense amplifier 48 via a sense line SL.

When the information stored in the memory cell 20 is read, the opposite ends 20a and 20b of the memory cell 20 are connected, for example, to a ground potential via the select transistors ST1 and ST2 and the data lines DL0 and DL1. At this time, the stored information is read based on a voltage generated at the connection 20c between the capacitors Cf1 and Cf2. More specifically, the stored information can be read by detecting a drain current flowing through the sense line SL of the processing transistor PT whose gate is connected to the connection 20c.

In FIG. 2, there is shown in plan an example of arrangement of the memory cell 20 and peripheral portions thereof. FIG. 3A is a cross-sectional view taken along line 3A—3A (i.e., a cross section of the capacitor Cf1). FIG. 3B is a cross-sectional view taken along line 3B—3B (i.e., a cross section of the aluminum wiring 43).

Figure 3A:
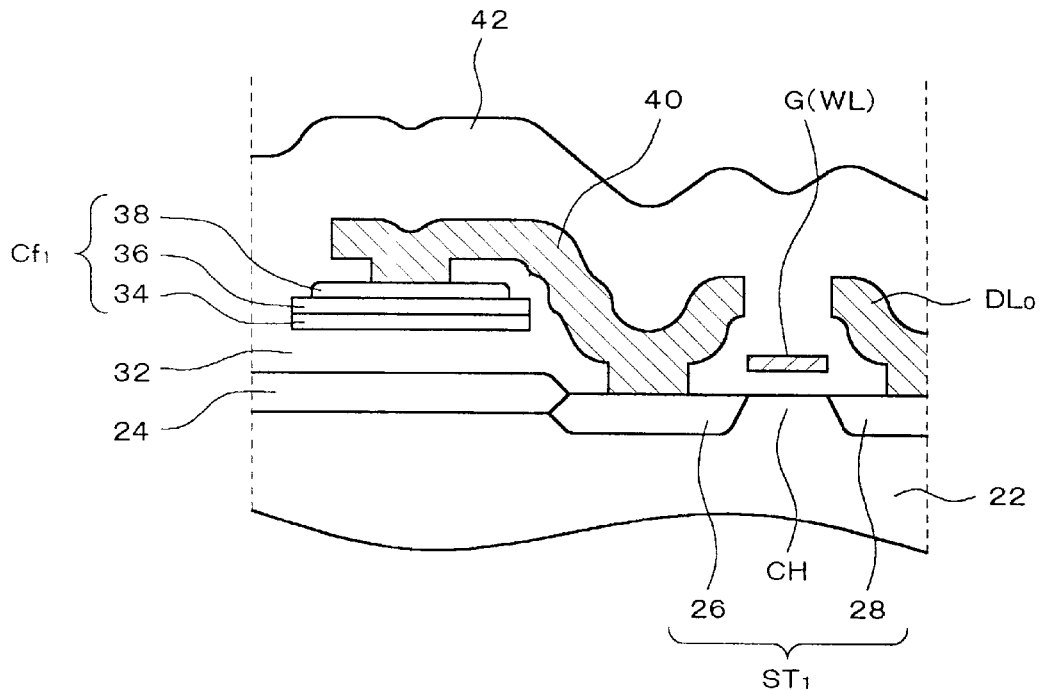
FIG. 3A is a cross-sectional view of a capacitor Cf1, taken along line 3A—3A of FIG. 2.
Figure 3B:
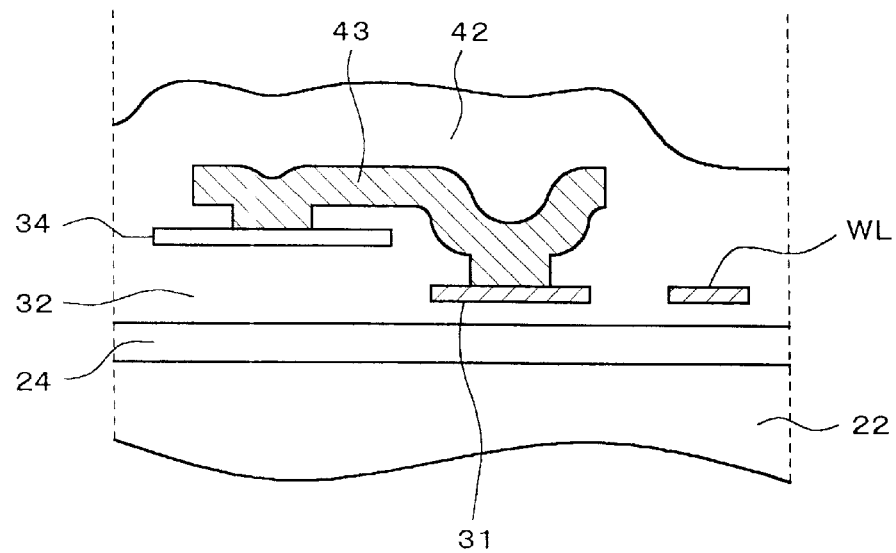
FIG. 3B is a cross-sectional view of an aluminum wiring 43, taken along line 3B—3B of FIG. 2.

As shown in FIG. 3A, an LOCOS 24 acting for isolation between elements is formed on a silicon substrate 22. The capacitor Cf1 is formed above the LOCOS 24 through an insulating layer 32. The capacitor Cf1 includes a lower electrode 34, a ferroelectric film 36 and an upper electrode 38 which are overlapped in this order.

The upper electrode 38 of the capacitor Cf1 is connected to a source 26 of the select transistor ST1 via the aluminum wiring 40. A drain 28 of the select transistor ST1 is connected to the data line DL0. A gate G is formed above a channel forming region CH, and connected to a gate of the select transistor ST2 via the word line WL (refer to FIG. 2). These elements are overlaid with a passivation film 42.

The capacitor Cf2 has almost the same structure as that of the capacitor Cf1. As shown in FIG. 2, the ferroelectric films 36 of the capacitors Cf1 and Cf2 are formed as a continuous film. Also, the lower electrodes 34 of the capacitors Cf1 and Cf2 are continuously formed and connected to the aluminum wiring 43 (refer to FIG. 3B). As described above, the aluminum wiring 43 is connected to the gate of the processing transistor PT via the gate wiring 31 (refer to FIG. 2).

Figure 5A:
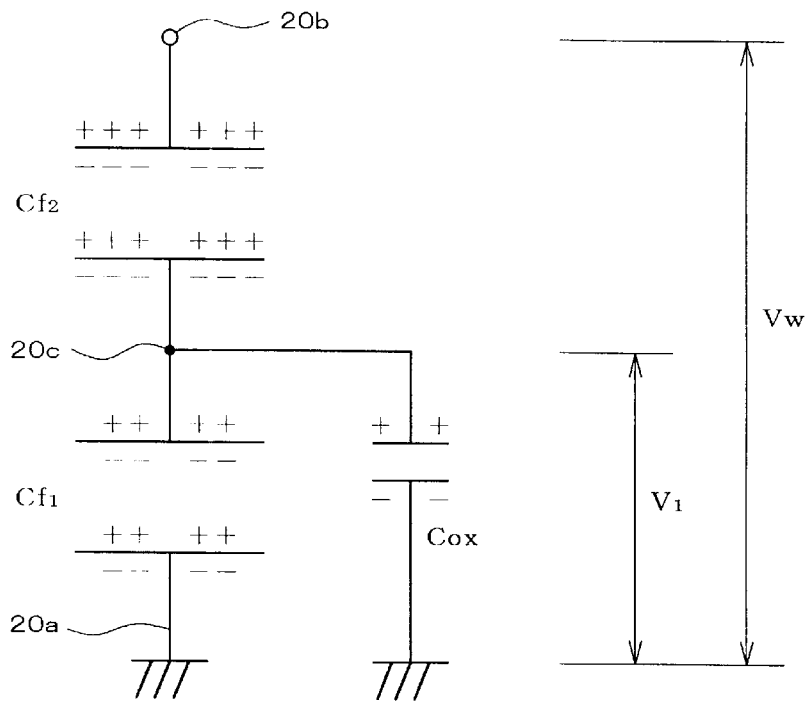
FIG. 5A is a schematic diagram showing an equivalent circuit of the memory cell 20 when an information "1" is written therein.
Figure 5B:
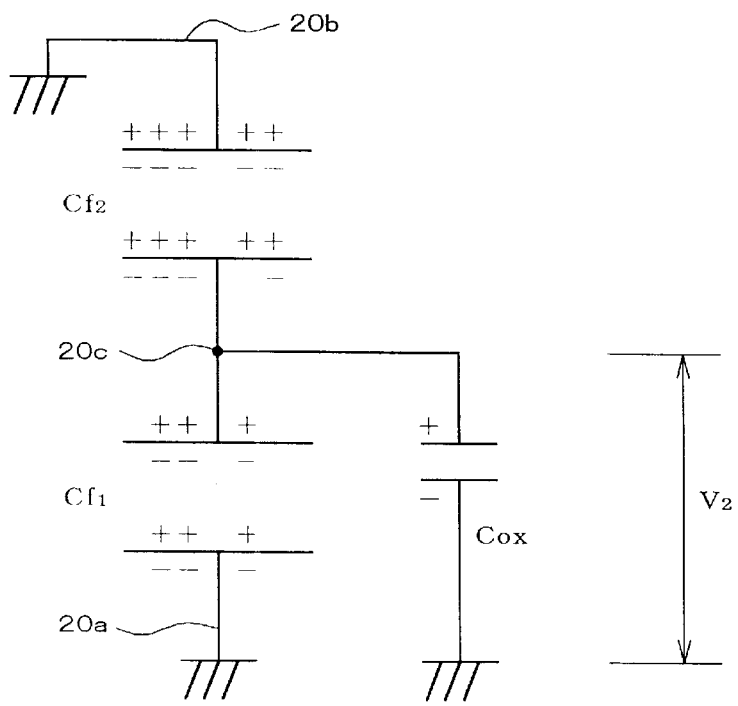
FIG. 5B is a schematic diagram showing an equivalent circuit of the memory cell 20 when an information "1" is read therefrom.
Figure 6:
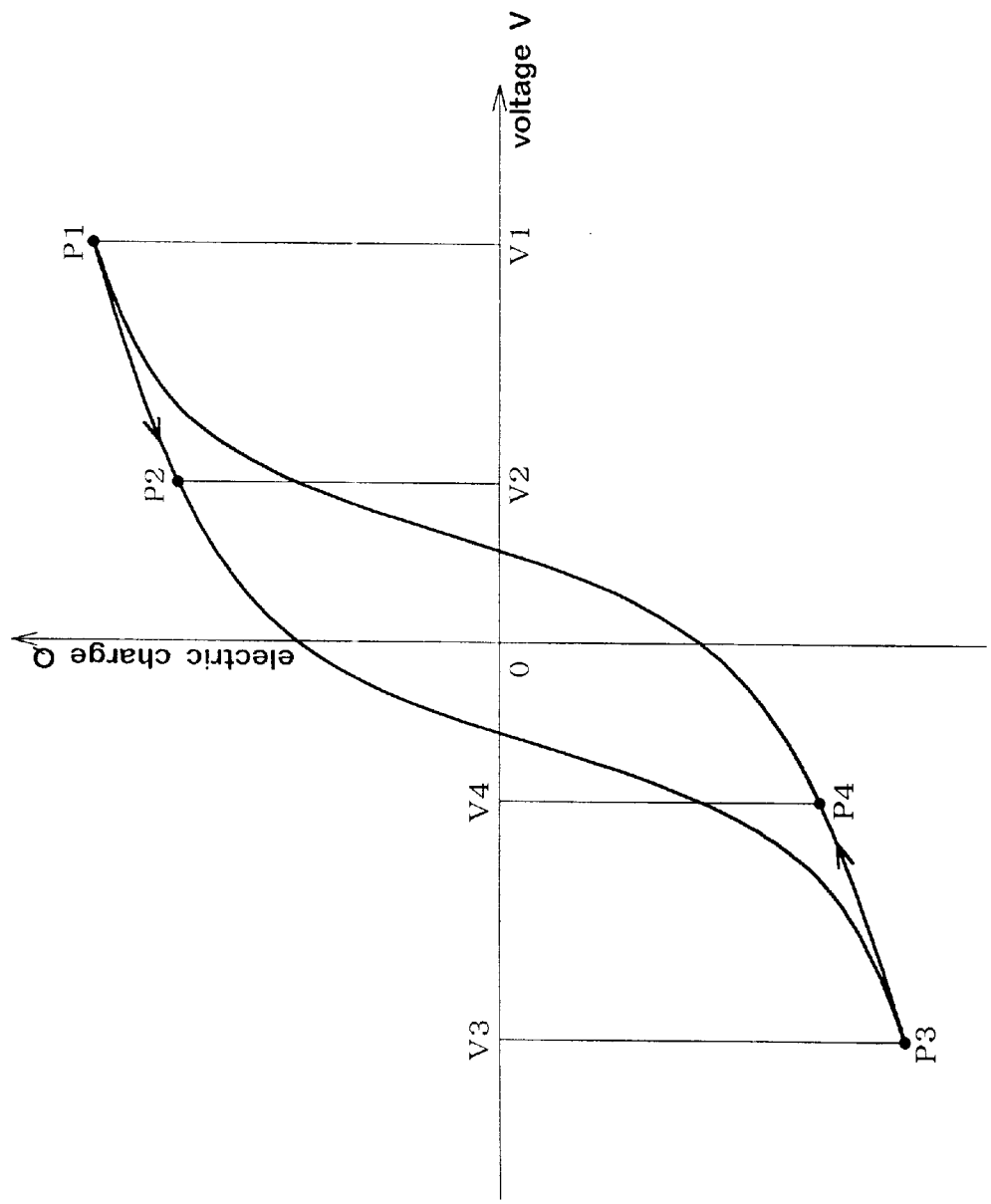
FIG. 6 is a graph showing a relationship between a voltage and an electric charge of the capacitor Cf1.
Figure 7:
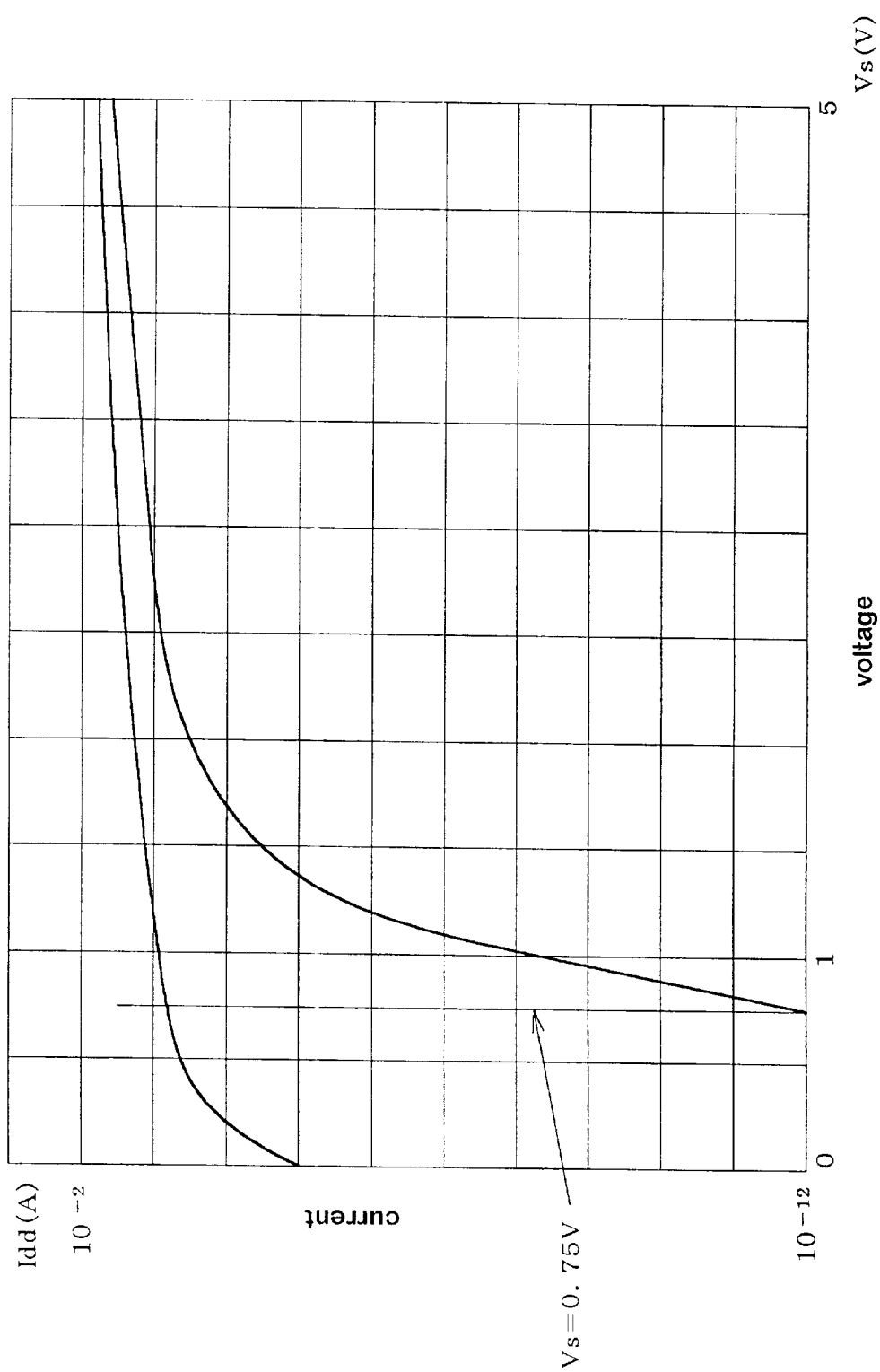
FIG. 7 is a graph showing a relationship between a read voltage Vs applied between a source and a drain of a processing transistor PT, and a drain current $I_{dd}$ thereof, when an information ("1" or "0") stored in the memory cell 20 is represented as parameters.

Next, the operations for writing an information in the memory cell 20 as shown in FIG. 1, and reading the written information from the memory cell 20, are explained below. FIG. 4A, shows an operation table used for writing the information, and FIG. 4B shows an operation table for reading the stored information. FIG. 5A schematically shows an equivalent circuit of the memory cell 20 in the case where the information "1" is written in the memory cell 20, and FIG. 5B schematically shows an equivalent circuit of the memory cell 20 in the case where the written information "1" is read from the memory cell 20. FIG. 6 is a graph showing a relationship between a voltage and an electric charge of the capacitor Cf1. FIG. 7 is a graph showing a relationship between a read voltage Vs applied between a source and a drain of the processing transistor PT, and a drain current $I_{dd}$ thereof, when the information ("1" or "0") written in the memory cell 20 is represented as parameters.

The operation for writing the information in the memory cell 20 is explained with reference to FIGS. 1 and 4A as well as FIGS. 5A and 6. In the case where the information "1" is written in the memory cell 20, the data line DL0 is set to "L" and the data line DL1 is set to "H" by the X decoder 44 (refer to FIG. 1), as shown in FIG. 4A. In addition, the word line WL is set to "H" by the Y decoder 46 (refer to FIG. 1). This causes the select transistors ST1 and ST2 to be turned ON, so that the end 20a of the memory cell 20 on the capacitor Cf1 side is set to "L" and the end 20b on the capacitor Cf2 side is set to "H".

Meanwhile, the sense line SL may be set to any state of "L", "H" and "OPEN", or to any other appropriate state.

In FIG. 5A, there is shown the equivalent circuit of the memory cell 20 when the information "1" is written in the memory cell 20. In the equivalent circuit, the gate oxide film of the processing transistor PT acts as a dielectric film of a capacitor $C0_x$. The sum of electric charges induced on the capacitors Cf1 and C0x is equal to an electric charge induced on the capacitor Cf2.

As described hereinbefore, since the capacitance of the capacitor C0x is as low as substantially negligible or ignorable upon writing relative to any of the capacitances of the capacitors Cf1 and Cf2, an actual electric charge induced on the capacitor C0x is extremely small. Accordingly, when the information is written in the memory cell 20, the capacitance of the capacitor C0x is ignored. Further, although the capacitances of the capacitors Cf1 and Cf2 both are not kept constant and actually varied depending on voltage applied and hysteresis thereof, it is assumed, for convenience of explanation, that the capacitances of the capacitors Cf1 and Cf2 in a state of FIG. 5A are maintained at constant values Cf1 and Cf2, respectively.

Providing that the relationship of Cf1=2Cf2 is established between the capacitors Cf1 and Cf2, the voltage generated across the capacitor Cf1 is given by the following equation:

$$V1=Cf2/(Cf1+Cf2)\cdot Vw=\tfrac{1}{3}\cdot Vw$$

Further, it is assumed that the voltage Vw applied between the opposite ends 20a and 20b is +5 V.

At this time, the polarization state of the capacitor Cf1 is indicated by the point P1 in FIG. 6. Since the divided voltage V1 is +5/3 V, it is recognized that the capacitor Cf1 undergoes polarization reversal.

In this condition, when the voltage applied between the opposite ends 20a and 20b is released (i.e., stand-by state), the equivalent circuit of the memory cell becomes similar to that shown in FIG. 5B. Specifically, although a part of the electric charge of each capacitor is discharged, a predetermined amount of the electric charge still remains therein because the capacitors Cf1 and Cf2 are of a ferroelectric type. As a result, a. voltage V2 is generated across the capacitor Cf1 due to the residual electric charge. At this time, the polarization state of the capacitor Cf1 is indicated by the point P2 in FIG. 6. As is apparent from FIG. 5B, the same voltage as V2 is also generated at the capacitor C0x.

When the information "0" is written in the memory cell 20, the data line DL0 is set to "H" and the data line DL1 is set to "L" in a manner reverse to in the case of writing the information "1", as shown in FIG. 4A. This causes the ends 20a and 20b of the capacitors Cf1 and Cf2 of the memory cell 20 to be set to "H" and "L", respectively.

In this case, the polarization state of the capacitor Cf1 is indicated by the point P3 in FIG. 6. Due to the fact that a divided voltage V3 is applied to the capacitor Cf1, it is recognized that the capacitor Cf1 undergoes polarization reversal. However, it should be noted that the direction of the polarization reversal is reverse to that in the case of writing the information "1".

In this condition, when the voltage applied between the opposite ends 20a and 20b is released, the polarization state of the capacitor Cf1 is shifted to the point P4 as shown in FIG. 6.

Next, the operation of reading the written information from the memory cell 20 is explained by referring to FIGS. 1 and 4B as well as FIGS. 5B, 6 and 7. When the information is read from the memory cell 20, both of the data lines DL0 and DL1 are set to "L" by the X decoder (refer to FIG. 1), as shown in FIG. 4B. In addition, the word line WL is set to "H" by the Y decoder (refer to FIG. 1). This allows the select transistors ST1 and ST2 to be turned ON, so that the ends 20a and 20b of the capacitors Cf1 and Cf2 of the memory cell 20 both are set to "L". Further, a read voltage Vs is applied to the sense line SL.

Assuming that the information "1" is stored in the memory cell 20, the polarization state of the capacitor Cf1 is indicated by the point P2 in FIG. 6. Specifically, the polarization state of the capacitor Cf1 becomes equal to the state in the case where the voltage applied between the opposite ends 20a and 20b is released (i.e., stand-by state). At this time, the voltage at the connection 20c, i.e., the voltage applied to the gate of the processing transistor PT, is equal to V2 (positive) as described hereinbefore.

On the other hand, assuming that the information "0" is stored in the memory cell 20, the polarization state of the capacitor Cf1 is indicated by the point P4 in FIG. 6. At this time, the voltage at the connection 20c, i.e., the voltage applied to the gate of the processing transistor PT, is equal to V4 (negative).

As described above, in the case where the information ("1" or "0") stored in the memory cell 20, i.e., the voltage applied to the gate of the processing transistor PT, is represented as parameters, the relationship between the read voltage Vs applied between the source and drain of the processing transistor PT and drain current $I_{dd}$ thereof is shown in FIG. 7.

As shown in FIG. 7, it is recognized that if the read voltage Vs is set, for example, to 0.75 V, the ratio between respective drain currents $I_{dd}$ corresponding to the information ("1" and "0") stored in the memory cell 20 is as large as about $10^8$:1. Thus, by detecting the drain current $I_{dd}$ by the sense amplifier 48, it becomes possible to determine what kind of information is stored in the memory cell 20.

As described above, the polarization state of the capacitor Cf1 in the read operation is equal to the stand-by state, i.e., such a state that the voltage applied between the opposite ends 20a and 20b is released. Therefore, the polarization state of the capacitor Cf1 is not changed by the read operation. Also, the polarization state of the capacitor Cf2 can remain unchanged. For this reason, even though the read operation is repeated many times, the information stored in the memory cell 20 can be retained without change.

Incidentally, although the data line DL1 is set to "L" in the above-mentioned read operation, the data line may also be set to "OPEN".

Figure 8:
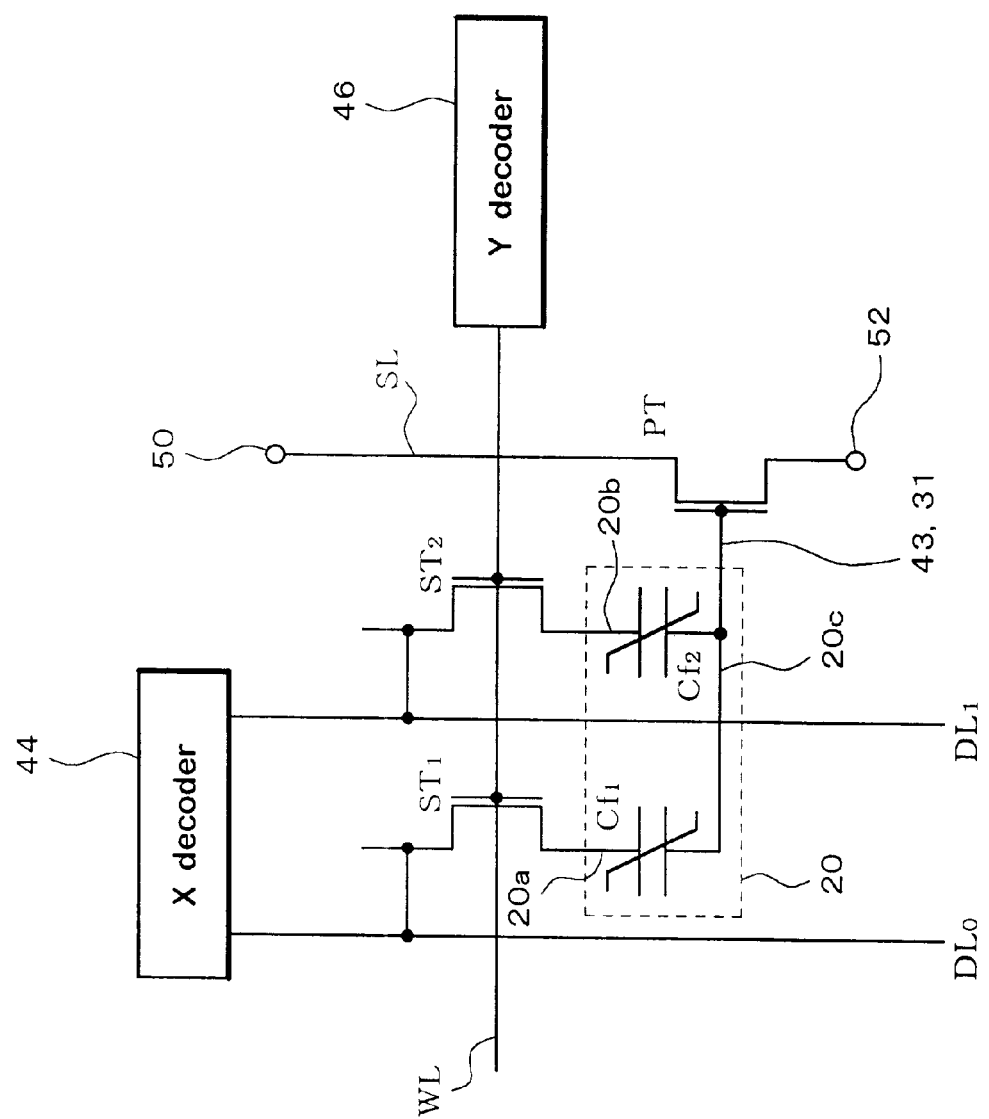
FIG. 8 is a circuit diagram showing a part of PLD (Programmable Logic Device) according to another preferred embodiment of the present invention.
Figure 10:
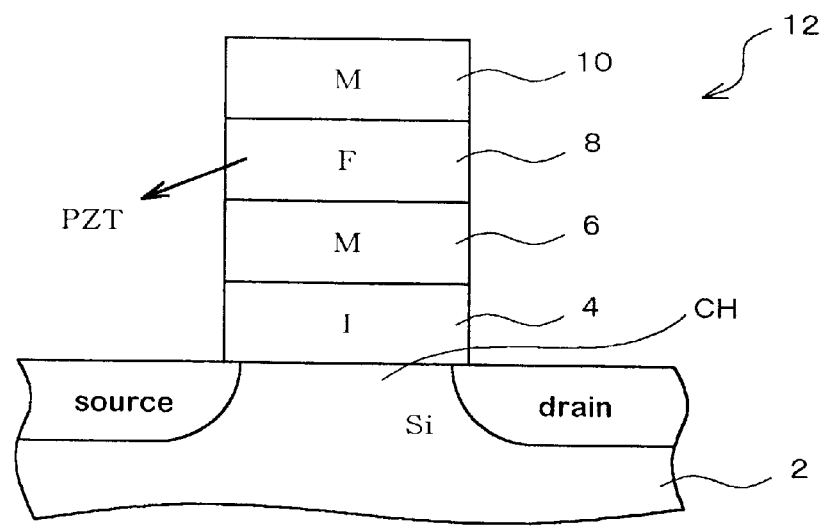
FIG. 10. is a view showing an example of a prior art FET using a ferroelectric film.
Figure 11:
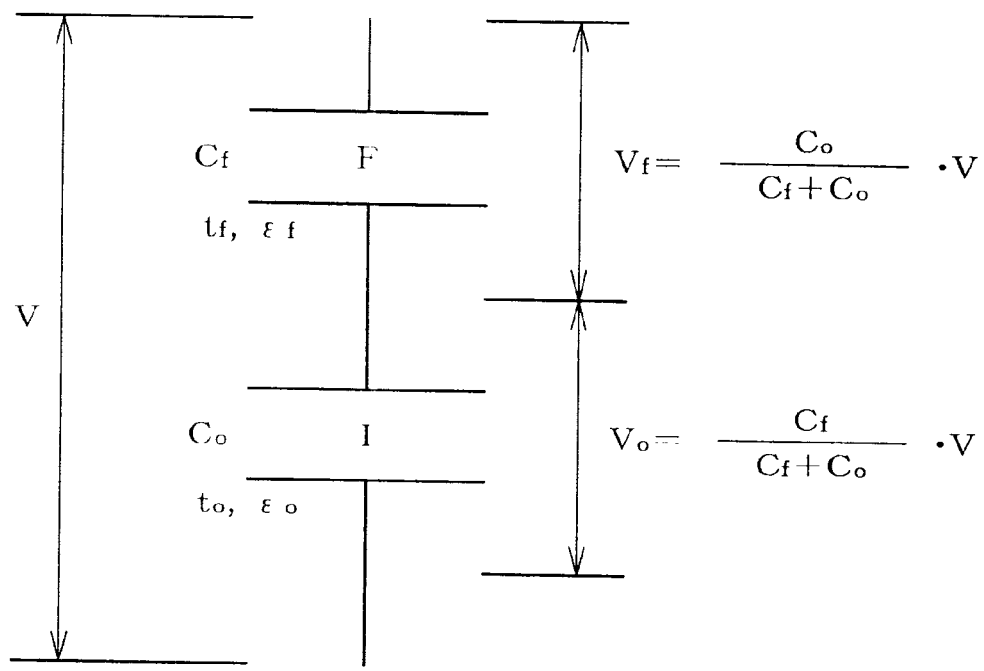
FIG. 11 shows an equivalent circuit of FET 12 upon writing.

Next, a part of PLD (Programmable Logic Device) according to another preferred embodiment of the present invention, is shown in FIG. 8. The PLD is provided with a memory cell 20 as a nonvolatile memory element similarly to the above-mentioned nonvolatile memory (refer to FIG. 1). The PLD shown in FIG. 8 is however different from the nonvolatile memory as shown in FIG. 1 at the point that no sense amplifier 48 is provided therein. In the PLD as shown in FIG. 8, a processing transistor PT can function as a switching transistor.

More specifically, the processing transistor PT is turned ON or OFF in response to the information stored in the memory cell 20, whereby a drain side terminal 50 and a source side terminal 52 of the processing transistor PT are electrically connected or disconnected. The drain side terminal 50 and the source side terminal 52 of the processing transistor PT are connected to logic elements (not shown) and so on. Accordingly, when many memory cells 20 and many processing transistors PT are provided and combined with a plurality of logic elements and further when appropriate information is written in respective memory cells 20, it is possible to obtain a logic circuit having desired functions. In addition, by changing the kind of information to be stored in the memory cell 20, a function of the logic circuit can be optionally varied at any time.

FIG. 9A shows an operation table used for writing the information in the memory cell 20. FIG. 9B shows an operation table used for performing a switching operation. The operation for writing the information in the memory cell 20 is the same as the operation of the above-mentioned nonvolatile memory (refer to FIG. 4A).

Next, the switching operation of the PLD is explained by referring to FIGS. 8 and 9B. When the switching operation is performed, both of the data lines DL0 and DL1 are set to "L" by the X decoder 44 (refer to FIG. 8), as shown in FIG. 9B. In addition, the word line WL is set to "H" by the Y decoder 46 (refer to FIG. 8). These settings are almost the same as those in the read operation of the above-mentioned nonvolatile memory (refer to FIG. 4B).

Accordingly, in the case where the information "1" is stored in the memory cell 20, the voltage applied to the gate of the processing transistor PT is V2 (positive) (refer to FIG. 6), so that the processing transistor PT is turned ON. On the other hand, in the case where the information "0" is stored in the memory cell 20, the voltage applied to the gate of the processing transistor PT is V4 (negative), so that the processing transistor PT is turned OFF. Thus, the switching operation can be performed.

Incidentally, as shown in FIG. 9B, upon the switching operation of the PLD, the data line DL1 may be set to "OPEN", similarly to the read operation of the above-mentioned nonvolatile memory (refer to FIG. 4B).

Also, although in the above-mentioned respective preferred embodiments, the area ratio between the upper electrodes 38 and 138 of the respective capacitors is set to about 2:1, the present invention is not limited thereto. The area ratio between the upper electrodes of the capacitors can be optionally set so as to correspond to threshold value of the processing transistor, saturation voltage of ferroelectrics constituting the capacitor or the like. For example, the area ratio between the upper electrodes 38 and 138 of the capacitors may be set to about 1:2 or about 1:1. It is desirable to set the area ratio to about 1:1, because the capacitors can be arranged with an increased area efficiency.

In addition, although in the above-mentioned embodiment, the coupling ratio (capacitance ratio) between the capacitors Cf1 and Cf2 is adjusted by controlling the area ratio between upper electrodes 38 and 138 of the capacitors, the present invention is not limited thereto. The coupling ratio can also be appropriately adjusted by controlling an area ratio between the lower electrodes of the capacitors or controlling an area ratio between the ferroelectric films, or by using the combination of these controlling methods.

Further, although in the above-mentioned preferred embodiments, the capacitance of the capacitor whose dielectric film is constituted by the gate oxide film of the processing transistor is set to as low a value as substantially negligible or ignorable upon writing relative to those of the first and second capacitors, the present invention is not limited thereto. For example, the capacitance of the capacitor whose dielectric film is constituted by the gate oxide film of the processing transistor can be set to as large a value as non-negligible or non-ignorable upon writing relative to any of capacitances of the first and second capacitors.

Further, although in the above-mentioned preferred embodiments the FET having a gate is used as the processing transistor, it is also possible to use a bipolar transistor as the processing transistor. Besides, there may be provided such an arrangement that the information read operation or the switching operation is performed by detecting the voltage at the connection between the first and second capacitors without using the processing transistor.

In the above-mentioned preferred embodiment, electric potentials at opposite ends of a set of the first and second capacitors connected to each other in series are set to a ground potential while a processing such as reading of information, switching operation or the like is performed. Alternatively, besides the ground potential, it may be configured such that the electric potentials at the opposite ends are substantially equal, and may also be configured such that the electric potential substantially different from that of one end can be given to the other end.

In the above-mentioned preferred embodiment, both capacitors connected in series are ferroelectric capacitors. However, one of the capacitors may be a ferroeletric capacitor and the other a paraelectric capacitor if they have equal dielectric constant.

In the above-mentioned preferred embodiment, a processing for reading the stored information and a switching processing based on the stored information are described as the examples of the processing carried out dependent on the voltage which corresponds to the stored information and is generated at the connection point of the first and second capacitors, but it is not limited to those processings. Thus, this invention can be widely applied to semiconductor devices provided with nonvolatile memory elements other than nonvolatile memory and PLD.

This invention is characterized by comprising a first capacitor provided with a ferroelectric film and a second capacitor which is provided with a ferroelectric film having a dielectric constant substantially equal to that of the ferroelectric film of the first capacitor and is connected to the first capacitor in series. In writing operation the ratio between the voltage applied to the first capacitor and the voltage applied to the second capacitor can be therefore adjusted to a desired ratio by appropriately selecting the surface area of both capacitors and the thickness of ferroelectric films thereof, independent upon dilectric constants of dielectric materials. Accordingly, memory elements can be configured using any desired ferroelectric material, without the restriction of dielectric constants.

This invention is characterized by equalizing the electric potential applied on the first end of the first capacitor and the electric potential applied on the second end of the second capacitor in a predetermined processing.

Thus, there occurs no change in remanent polarization in ferroelectric films of capacitors in a predetermined processing such as reading of stored information and switching operation on the basis of a voltage generated at the connection between the first and second capacitors. There is little possibility to cause processing error if a predetermined processing is performed repeatedly. In other words, allowing a predetermined processing without destruction of any stored data, nonvolatile memory element having a high operation speed in processing operation, lower consumption of power and less degradation of ferroelectric film can be obtained, and a nonvolatile memory element having extremely high reliability is realized, regardless of processing cycles.

This invention is characterized by providing a processing transistor, the gate of which is coupled to the connection between the first and second capacitors to carry out the predetermined processing.

The electric potential at the connection can be therefore converted to the drain current of the processing transistor and then the stored information is read based on the drain current. The stored information can be read easily and exactly by, for example, detecting whether the drain current is more or less than the predetermined reference value.

Furthermore, the processing transistor may be switched on the basis of the electric potential at the connection. Corresponding to the stored information, the processing transistor can be switched ON or OFF in response to the electric potential more or less than the reference value.

This invention is characterized in that the capacitance of the capacitor included in the processing transistor and having a gate oxide film as a dielectric film is small ignorable upon storing information as compared with the capacitances of the first and second capacitors.

Accordingly, when a voltage corresponding to the information is applied on the opposite ends of the first capacitor and second capacitor connected to each other for storing information, the voltage applied on the opposite ends is divided, approximately corresponding to the capacitance ratio between the capacitances of the first and second capacitor. Thus, a voltage dividing ratio near to the desired one may be obtained by appropriately selecting the capacitance ratio between the capacitances of the first and second capacitor.

This invention is characterized in that the capacitance of the first capacitor is substantially equal to that of the second capacitor.

Thus, the same thickness of the first and second capacitors results in the same surface area for both capacitors. This causes to increase in efficiency of surface area and allows the memory element to be configured in small size.

This invention is characterized by providing two capacitors having a substantially same dielectric constant and connected to each other in series, at least one of the capacitors being a ferroelectric capacitor, and applying a voltage corresponding to the information to be stored, on the opposite ends of the capacitors in series to store the information based on the divided voltage on the ferroelectric capacitor.

Thus, for storing information, the voltage dividing ratio can be set to a desired ratio by appropriate selection of surface area for both capacitors and thickness of ferroelectric films of the ferroelectric capacitor.

This invention is further characterized by providing two capacitors having a substantially same dielectric constant and connected to each other in series, at least one of the capacitors being a ferroelectric capacitor in which an information is stored, and carrying out a predetermined processing on the basis of the voltage which is, when the electric potentials at the opposite ends are set to a equal value, generated corresponding to the stored information, at a point where both capacitor are connected.

Thus, there occurs no change in remanent polarization in ferroelectric films of capacitors in a predetermined processing such as reading of the stored information and switching operation on the basis of the stored information. There is also little possibility to cause processing error if a predetermined processing is repeated many times.

The present invention has been described in terms of preferred embodiments. Terms used herein are for the purpose of description but not for limitation of the invention. It is understood that variations and modifications thereof may be made without departing from the true spirit and scope of the invention.

What is claimed is:

1. A nonvolatile memory element for storing an information with the utilization of hysteresis characteristics of a ferroelectric, comprising:

a first capacitor provided with a ferroelectric film and electrically coupled with first and second ends;

a second capacitor provided with a ferroelectric film having a dielectric constant substantially equal to that of said ferroelectric film of said first capacitor and electrically coupled with first and second ends, said second end of said first capacitor being connected to said first end of said second capacitor so that said first and second capacitors are connected in series to each other;

means for applying a voltage corresponding to said information between said first end of said first capacitor and said second end of said second capacitor; and processing means connected to said first and second capacitors for performing predetermined processing according to a voltage at a point at which said second end of said first capacitor and said first end of said second capacitor are connected.

2. A nonvolatile memory element according to claim 1, wherein said processing means is operable while the electric potential at said first end of said first capacitor is substantially equal to that at said second end of said second capacitor.

3. A nonvolatile memory element according to claim 2, wherein said processing means is operable while said first end of said first capacitor and said second end of said second capacitor are substantially grounded.

4. A nonvolatile memory element according to claim 1, wherein said processing means comprises a processing transistor having a gate coupled to said point.

5. A nonvolatile memory element according to claim 4, wherein said processing transistor includes a capacitor which has a dielectric film made of a gate oxide film and which has a small capacitance ignorable upon storing said information as compared with the capacitances of said first and second capacitors.

6. A nonvolatile memory element according to claim 1, wherein the capacitance of said first capacitor is substantially the same as that of said second capacitor.

7. A nonvolatile memory element according to claim 1, wherein said processing means includes means for reading said information.

8. A nonvolatile memory element according to claim 7, wherein said reading means is operable while the electric potential at said first end of said first capacitor is substantially equal to that at said second end of said second capacitor.

9. A nonvolatile memory element according to claim 8, wherein said reading means is operable while said first end of said first capacitor and said second end of said second capacitor are substantially grounded.

10. A nonvolatile memory element according to claim 7, wherein said reading means comprises a processing transistor having a gate coupled to said point.

11. A nonvolatile memory element according to claim 10, wherein said processing transistor includes a capacitor which has a dielectric film made of a gate oxide film and which has a small capacitance ignorable upon storing said information as compared with the capacitances of said first and second capacitors.

12. A nonvolatile memory element according to claim 7, wherein the capacitance of said first capacitor is substantially the same as that of said second capacitor.

13. A nonvolatile memory element according to claim 1, further comprising switching means operable according to a voltage at said point.

14. A nonvolatile memory element according to claim 13, wherein said switching means is operable while the electric potential at said first end of said first capacitor is substantially equal to that at said second end of said second capacitor.

15. A nonvolatile memory element according to claim 14, wherein said switching means is operable while said first end of said first capacitor and said second end of said second capacitor are grounded.

16. A nonvolatile memory element according to claim 13, wherein said switching means comprises a processing transistor having a gate coupled to a point at which said second end of said first capacitor is connected to said first end of said second capacitor.

17. A nonvolatile memory element according to claim 16, wherein said processing transistor includes a capacitor which has a dielectric film made of a gate oxide film and which has a small capacitance ignorable upon storing said information as compared with the capacitances of said first and second capacitors.

18. A nonvolatile memory element according to claim 13, wherein the capacitance of said first capacitor is substantially the same as that of said second capacitor.

19. A method of storing an information with the utilization of hysteresis characteristics of a ferroelectric, comprising the steps of:

providing first and second capacitors having substantially the same dielectric constant and each having first and second ends, said second end of said first capacitor being connected to said first end of said second capacitor so that said first and second capacitors are connected in series to each other, and at least one of said first and second capacitors being said ferroelectric; and applying a voltage corresponding to said information between said first end of said first capacitor and said second end of said second capacitor, so that said information is stored in said ferroelectric.

20. A method of processing a stored information with the utilization of hysteresis characteristics of a ferroelectric, comprising the steps of:

providing first and second capacitors having substantially the same dielectric constant and each having first and second ends, said second end of said first capacitor being connected to said first end of said second capacitor so that said first and second capacitors are connected in series to each other, and at least one of said first and second capacitors being said ferroelectric in which said information is stored;

equalizing the potential of said first end of said first capacitor and the potential of said second end of said second capacitor, so that a voltage is generated at a point at which said second end of said first capacitor and first end of said second capacitor are connected; and processing said stored information according to said voltage.

* * * * *